US008767356B2

(12) United States Patent
Leung et al.

(10) Patent No.: US 8,767,356 B2
(45) Date of Patent: Jul. 1, 2014

(54) MAGNETORESISTIVE SENSOR WITH FUNNEL-SHAPED FREE LAYER, MAGNETIC HEAD, HEAD GIMBAL ASSEMBLY, AND DISK DRIVE UNIT WITH THE SAME

(75) Inventors: Chiuming Leung, Hong Kong (CN); Kosuke Tanaka, Tokyo (JP); Kazuki Sato, Tokyo (JP); Cheukwing Leung, Hong Kong (CN); Juren Ding, Hong Kong (CN); Rongkwang Ni, Hong Kong (CN); Wanyin Kwan, Hong Kong (CN); Mankit Lee, Hong Kong (CN)

(73) Assignees: SAE Magnetics (H.K.) Ltd., Hong Kong (CN); TDK Corporation, Tokyo (JP)

( * ) Notice: Subject to any disclaimer, the term of this patent is extended or adjusted under 35 U.S.C. 154(b) by 118 days.

(21) Appl. No.: 12/801,518

(22) Filed: Jun. 11, 2010

(65) Prior Publication Data

US 2011/0235214 A1   Sep. 29, 2011

(30) Foreign Application Priority Data

Mar. 23, 2010  (CN) .......................... 2010 1 0139380

(51) Int. Cl.
*G11B 5/39*  (2006.01)
(52) U.S. Cl.
USPC .................................. 360/324.12; 360/324.2
(58) Field of Classification Search
CPC ....................................................... G11B 5/398

USPC .................................. 360/324.2, 314, 324.12
See application file for complete search history.

(56) References Cited

U.S. PATENT DOCUMENTS

| 5,748,415 A * | 5/1998 | Christner et al. .............. 360/327 |
| 6,178,074 B1 * | 1/2001 | Gill ............................. 360/324.2 |
| 2011/0050211 A1 * | 3/2011 | Gao et al. ...................... 360/324 |

FOREIGN PATENT DOCUMENTS

| JP | 06-215333 | 8/1994 |
| JP | 2000-200404 | 7/2000 |

* cited by examiner

*Primary Examiner* — Craig A. Renner
(74) *Attorney, Agent, or Firm* — Nixon & Vanderhye, P.C.

(57) ABSTRACT

An MR sensor includes a first shielding layer, a second shielding layer, an MR element formed therebetween, and a pair of hard magnet layers respectively placed on two sides of the MR element. The MR element includes an AFM layer formed on the first shielding layer, a pinned layer formed on the AFM layer and a free layer formed between the pinned layer and the second shielding layer. The free layer is funnel-shaped, which has a first edge facing an air bearing surface and a second edge opposite the first edge, and the first edge has a narrower width than that of the second edge. The MR sensor can improve MR height control performance, and improve the ESD performance and decrease the PCN and RTN and, in turn, get a more stable performance. The present invention also discloses a magnetic head, an HGA and a disk drive unit.

10 Claims, 7 Drawing Sheets

MAGNETORESISTIVE SENSOR WITH FUNNEL-SHAPED FREE LAYER, MAGNETIC HEAD, HEAD GIMBAL ASSEMBLY, AND DISK DRIVE UNIT WITH THE SAME

FIELD OF THE INVENTION

The present invention relates to information recording disk drive devices and, more particularly to a magnetoresistive (MR) sensor, a magnetic head, and a head gimbal assembly (HGA) and disk drive unit with the same.

BACKGROUND OF THE INVENTION

Hard disk drive incorporating rotating magnetic disks is commonly used for storing data in the magnetic media formed on the disk surfaces, and a movable slider including read sensors are generally used to read data from tracks on the disk surfaces.

Presently, MR sensor is used as a kind of popular read sensor because of its better capability to read data from disk surface at a greater track and linear densities than traditional film inductive slider.

Now, several types of MR sensors have been widely used by disk drive manufacturers in succession. One is anisotropic magnetoresistive (AMR) sensor, which makes the angle between the magnetization direction and the direction of sense current flowing through the MR element change and, in turn, cause a change the resistance of the MR element and a corresponding change in the sensed current or voltage. Another type is giant magnetoresistive (GMR) sensor manifesting the GMR effect. The GMR effect is a phenomenon that the magnetoresistive ratio (MR ratio) will change under an external magnetic field. The GMR sensor comprises two ferromagnetic layers and a non-ferromagnetic layer sandwiched between the two ferromagnetic layers. The resistance of the non-ferromagnetic layers varies with the magnetic moments of the ferromagnetic layers, the conduction electrons and the spin-dependent scattering. Still another type of MR sensor is tunnel magnetoresistive (TMR) sensor, which has become the mainstream MR sensor due to its more remarkable change of MR ratio by replacing AMR sensor and GMR sensor.

As shown in FIG. 1, a TMR sensor 500 with a rectangular MR element includes two magnetic layers 503, 505, a tunnel barrier layer 504 sandwiched therebetween, two electrode layers 502, 506 to sandwich the magnetic layers 503, 505, and a substrate 501 to hold the above layers. When a current is fed to the magnetic layers 503, 505, a tunnel current passing through the tunnel barrier layer 504 will change according to the relative angle between magnetization directions of the two magnetic layers 503, 505. Thus the recorded data can be read from a magnetic medium because the signal field causes a change of magnetization direction of the two magnetic layers, which in turn causes a change in resistance of the TMR sensor.

However, big thermal noises and low read sensitivity problems always exist in the above-mentioned MR sensors and influence their working performance seriously.

For solving thermal noise problems, an improved MR sensor is disclosed in JP patent publication application No. JP 2000-200404. As illustrated in FIG. 2, a trapezoidal MR element 10 of the MR sensor has a narrower top edge 37 and a wider bottom edge 27 facing air bearing surface (ABS) 21. A pair of hard magnets 11 is respectively placed at the side of the MR element 10. The hard magnet 11 provides a longitudinal bias field to the MR element 10, which has a magnetic direction 12. As known, in the area of the MR element near the hard magnet 11, the longitudinal bias is stronger than the area far from the hard magnet 11, and a stronger longitudinal bias is helpful for decreasing thermal noises. As shown in FIG. 2, a hatched portion of the trapezoidal MR element 10 indicates a stronger longitudinal bias area, and the other portion is a weak longitudinal bias area. Comparing with the rectangular MR element of the traditional MR sensor, the weak longitudinal bias area of the trapezoidal MR element 10 is reduced under a same width of the bottom edge and a same height of MR element (MR height). Thus, the thermal noises of the whole MR element and then the MR sensor are reduced. Unfortunately, because the bottom edge 27 facing ABS is still wider, a high read sensitivity is difficult to attain.

In order to solve the problem, referring to FIG. 3, another MR sensor is disclosed in JP patent publication application No. JP 6-215333. As shown in FIG. 3, a MR element of the MR sensor comprise a trapezoidal track width restriction layer 61 which has a wider edge 62 and a narrow bottom edge 63 facing ABS 65. For the sensing area, its magnetization direction is generally parallel with the magnetic layer, and its signal magnetic field decreases gradually with increasing of the distance from the ABS. Comparing with the trapezoidal MR element 10 shown in FIG. 2, since the sensing area facing the ABS becomes narrower under a same total sensing area, thus when a same current is provided, a big current density crossing the sensing area near the ABS is attained, and then a higher read sensitivity will be obtained.

As well known, lapping process of the MR element is a very important process in the manufacturing process of a slider. That is, the edge of the MR element facing the ABS, such as the bottom edge 27 shown in FIG. 2 or the bottom edge 63 shown in FIG. 3, is required to be lapped so as to achieve a predetermined MR height. However, since the above-mentioned trapezoidal MR elements both has a wider bottom edge being lapped, so the lapping process of the bottom edge is difficult to control, and making the MR height difficult to control.

For a slider with MR sensor, a narrower and denser data track of the disk is required so as to attain an increased recording density. So it is desired for reducing the size of the sensor incorporated in the reducing slider. That is, the track width rests with the width of the MR element facing ABS, if the width of the MR element is too big, the track width is increased and, in turn, decreasing the data track density, which affects the read performance of the slider. However, reducing the size of the sensor (namely the width of the MR element, MR height, and total sensor area) will effect on the performance of the sensor. For example, if the sensor area is too small, the resistance area is decreased to cause reliability of the MR sensor become poorer. At the same time, the current density crossing the sensor area is increased to bring electro-static discharge (ESD) problem. In one word, it is a big problem to solve for existing MR sensor.

Hence, it is desired to provide an improved MR sensor for a slider to overcome the above-mentioned drawbacks.

SUMMARY OF THE INVENTION

One objective of the present invention is to provide a MR sensor for a slider which can improve MR height control performance, and improve the ESD performance and decrease the popcorn noise (PCN) and random telegraph noise (RTN) and, in turn, get a more stable performance.

Another objective of the present invention is to provide a magnetic head having a MR sensor which can improve MR height control performance, and improve the ESD performance and decrease the PCN and RTN and, in turn, get a more stable performance.

Yet another objective of the present invention is to provide a head gimbal assembly having a MR sensor which can improve MR height control performance, and improve the ESD performance and decrease the PCN and RTN and, in turn, get a more stable performance.

A further objective of the present invention is to provide a disk drive unit having a MR sensor which can improve MR height control performance, and improve the ESD performance and decrease the PCN and RTN and, in turn, get a more stable performance.

To achieve the above objectives, a MR sensor comprises a first shielding layer, a second shielding layer, a MR element formed therebetween, and a pair of hard magnet layers respectively placed on two sides of the MR element. The MR element comprises an antiferromagnetic (AFM) layer formed on the first shielding layer, a pinned layer formed on the AFM layer and a free layer formed between the pinned layer and the second shielding layer. In the invention, the free layer is funnel-shaped, which having a first edge facing the air bearing surface and a second edge opposite to the first edge, and the first edge has a narrower width than that of the second edge.

Preferably, the free layer substantially narrows from the first edge to the second edge in a parabola. Preferably, the MR element further comprises a cap layer formed between the free layer and the second shielding layer. Selectively, the MR element may further comprise an insulating tunnel barrier layer formed between the pinned layer and the free layer.

A magnetic head of the invention comprises a MR sensor and a write head formed on the MR sensor. The MR sensor comprises a first shielding layer, a second shielding layer, a MR element formed therebetween, and a pair of hard magnet layers respectively placed on two sides of the MR element. The MR element comprises an AFM layer formed on the first shielding layer, a pinned layer formed on the AFM layer and a free layer formed between the pinned layer and the second shielding layer. The free layer is funnel-shaped, which having a first edge facing the air bearing surface and a second edge opposite to the first edge, and the first edge has a narrower width than that of the second edge.

A HGA of the invention comprises a slider with a MR sensor, and a suspension to support the slider. The MR sensor comprises a first shielding layer, a second shielding layer, a MR element formed therebetween, and a pair of hard magnet layers respectively placed on two sides of the MR element. The MR element comprises an AFM layer formed on the first shielding layer, a pinned layer formed on the AFM layer and a free layer formed between the pinned layer and the second shielding layer. The free layer is funnel-shaped, which having a first edge facing the air bearing surface and a second edge opposite to the first edge, and the first edge has a narrower width than that of the second edge.

A disk drive unit of the invention comprises a HGA with a slider, a drive arm to connect with the HGA, a rotatable disk and a spindle motor to spin the disk, and a slider with a MR sensor for reading data from the disk. The MR sensor comprises a first shielding layer, a second shielding layer, a MR element formed therebetween, and a pair of hard magnet layers respectively placed on two sides of the MR element. The MR element comprises an AFM layer formed on the first shielding layer, a pinned layer formed on the AFM layer and a free layer formed between the pinned layer and the second shielding layer. The free layer is funnel-shaped, which having a first edge facing the air bearing surface and a second edge opposite to the first edge, and the first edge has a narrower width than that of the second edge.

In comparison with the prior art of the trapezoidal MR sensor, a narrower first edge of the funnel-shaped free layer in the present invention can be obtained under a same total sensing area and a same width of the second edge. When the narrower first edge of the MR element facing the ABS is lapped, the lapping quantity is thus decreased comparing with the prior art and then the lapping time is also shortened and, in turn, improve the lapping efficiency and make the lapping easier. Moreover, because the lapping of the first edge of the MR element is easier, thus the MR height becomes much easier to be control. On the other hand, since the width of the MR element is decreased under the same total sensing areas, namely the track width can be decreased and, in turn, the data track density is increased so as to improve the read performance of the slider.

Furthermore, in comparison with the traditional trapezoidal MR element, due to the funnel-shaped design of the free layer, the total sensing area of the MR sensor is increased under a same MR height and a width of the free layer, namely the same data track width. As the total sensing area becomes larger, a bigger resistance area can be used to attain an improved the MR ratio, and thus an improved ESD performance can be acquired. Moreover, the free layer edge domain is more stable to decrease or even be eliminated the thermal noises, for example the PCN and RTN, causing the performance of the MR sensor to be improved.

Other aspects, features, and advantages of this invention will become apparent from the following detailed description when taken in conjunction with the accompanying drawings, which are a part of this disclosure and which illustrate, by way of example, principles of this invention.

BRIEF DESCRIPTION OF THE DRAWINGS

The accompanying drawings facilitate an understanding of the various embodiments of this invention. In such drawings.

DETAILED DESCRIPTION OF ILLUSTRATED EMBODIMENTS

Figure 1:
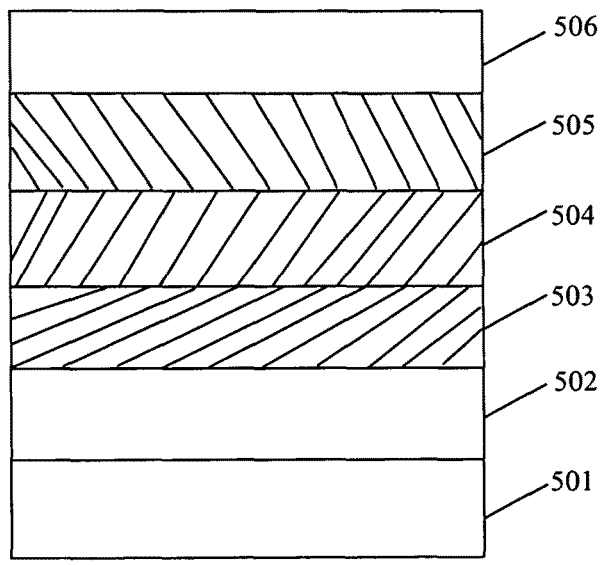
FIG. 1 is a cross-section view of the conventional TMR sensor.
Figure 2:
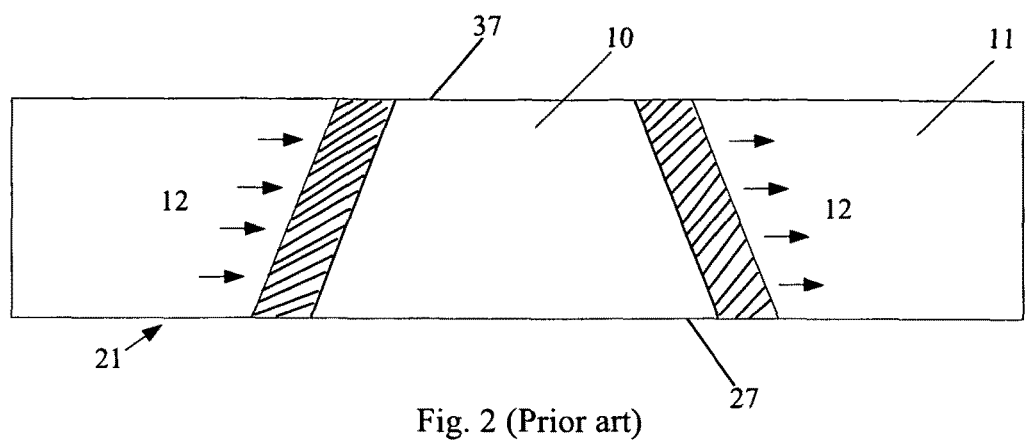
FIG. 2 is a view of a conventional MR element.
Figure 3:
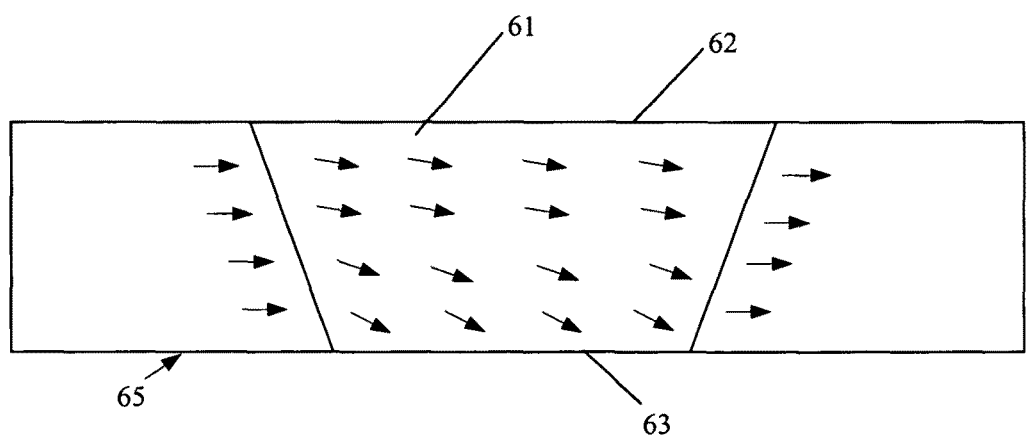
FIG. 3 is a view of another conventional MR element, showing the magnetization of the sensing area.

Various preferred embodiments of the invention will now be described with reference to the figures, wherein like reference numerals designate similar parts throughout the various views. As indicated above, the invention is directed to a MR sensor for a slider. The MR sensor has a MR element which comprises a funnel-shaped free layer, which has a first edge facing ABS and a second edge opposite the first edge, and the width of the first edge is narrower than that of the second edge. By such a design of a MR sensor of slider, a lapping area for the first edge facing ABS can be reduced and then a MR height of the MR sensor become easier to control, and simultaneously a big sensing area and a improved ESD performance can be attained and thermal noises can be reduced or even be eliminated.

Several example embodiments of a MR sensor for a magnetic head of a HGA of a disk drive unit will now be described. It is noted that the MR sensor may be implemented in any suitable HGA and/or disk drive device having such a MR sensor having the above-mentioned advantages. That is, the invention may be used in any suitable device having a MR sensor in any industry.

The conventional magnetic head for a slider typically includes a read portion for reading data from the disk, and a write portion for writing data into the disk. The read portion is generally formed by a MR sensor, such as Current Perpendicular to Plane (CPP) sensor, Current In Plane (CIP) sensor, TMR sensor, GMR sensor, or AMR sensor. For being understood well, the present description only concentrates on the embodiment of the CPP-TMR sensor. Obviously, the persons ordinarily skilled in the art can understand the application of the present invention on the other sensors after reading the following description. Now, a detailed description of the slider with the MR sensor according to a preferred embodiment of the present invention will be illustrated as following.

Figure 4:
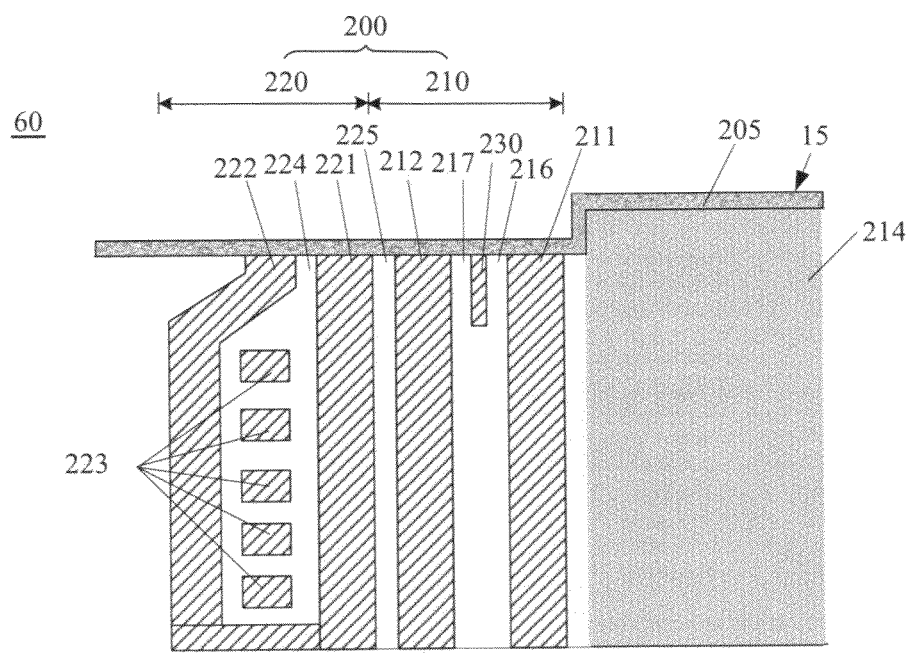
FIG. 4 is a cross-section view of a slider according to an embodiment of the present invention.

FIG. 4 is a cross-section view of the slider 60 according to an embodiment of the present invention. The slider 60 is lapped to form an ABS 15 being spaced from a surface of a rotating disk 40 (referring to FIG. 9) by air bearing. The slider 60 includes a substrate 214 and a magnetic head 200 formed on the substrate 214 for reading or writing data. Concretely, the magnetic head 200 includes an MR sensor 210 formed on the substrate 214 and a write head 220 formed on the MR sensor 210. The MR sensor 210 includes a first shielding layer 211 formed on the substrate 214, a first gap layer 216 and a second gap layer 217 formed on the first shielding layer 211, an MR element 230 sandwiched between the first gap layer 216 and the second gap layer 217, and a second shielding layer 212 formed on the second gap layer 217. The first gap layer 216 and the second gap layer 217 are connected with each other at their rear ends thereof far from the ABS 15. The first gap layer 216 and the second gap layer 217 are made of a non-magnetic and conductive material, and adapted for preventing leakage of magnetism toward the first and second shielding layers 211, 212. The write head 220 includes a first write pole 221, a second write pole 222, coils 223 and an insulation layer 224 sandwiched between the first and second write pole 221, 222. All of the surfaces of the elements, namely the surfaces facing the ABS 15, are covered by an overcoat 205 so as to prevent or decrease the slider erosion. A third gap layer 225 is formed between the second shielding layer 212 of the MR sensor 210 and the first write pole 221.

During writing, signal current is conducted through the coils 223 and flux is induced into the first and second write pole 221, 222, which causes flux to fringe across the pole tips at the ABS 15. This flux magnetizes circular tracks on the rotating disk 40 during a write operation. During a read operation, magnetized region on the rotating disk 40 injects flux into the MR sensor 210, causing the resistance of the MR sensor 210 to change. These resistance changes are detected by detecting voltage changes or current changes across the MR sensor 210.

Figure 5:
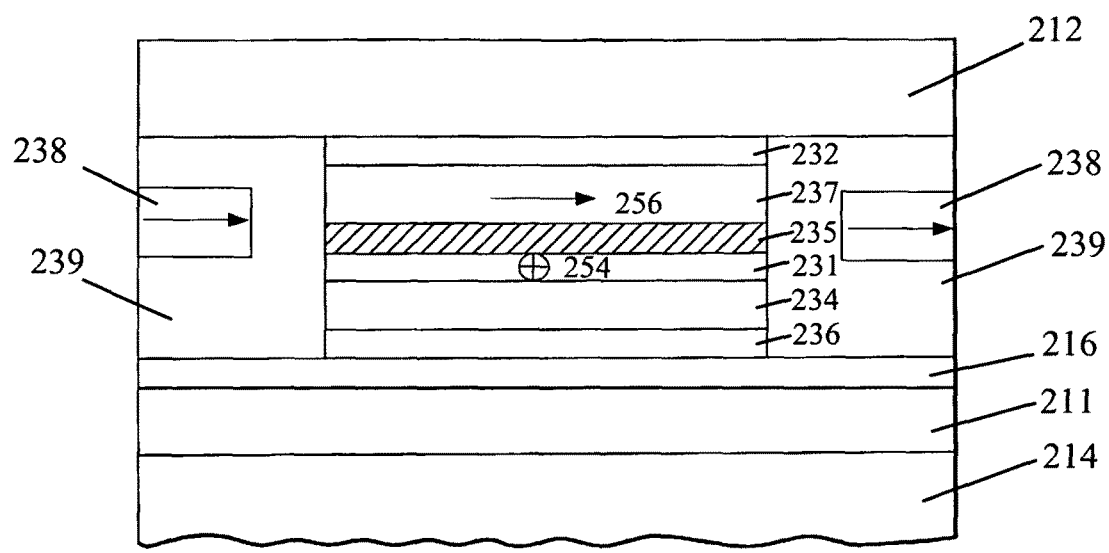
FIG. 5 is a cross-section view of a MR sensor of the slider shown in FIG. 4.

FIG. 5 is a cross-section view of the MR sensor 210 of the magnetic head 200 shown in FIG. 4. As illustrated, a MR element 230 of the MR sensor 210 includes a pinning layer 236, an AFM layer 234, a pinned layer 231, a tunnel barrier layer 235, a free layer 237, and a cap layer 232. The pinning layer 236 formed on the first gap layer 216 can be made of an antiferromagnetic material. The AFM layer 234 is formed on the pinning layer 236. Concretely, the AFM layer 234 is made of antiferromagnetic material, such as NiO. The pinned layer 231 formed on the AFM layer 234 is magnetic, containing a ferromagnetic substance selected from Fe, Co, Ni, CoFe and NiFe, for example. The tunnel barrier layer 235 is a thin nonmagnetic insulating film formed above the pinned layer 231, and concretely, the tunnel barrier layer 235 is made of any of $Al_2O_3$, NiO, GdO, MgO, $Ta_2O_5$, $TiO_2$, and $WO_2$, for example. The free layer 237 formed on the tunnel barrier layer 235 is magnetic. Formed on the free layer 237 is the cap layer 232 for protecting the other layers, which can be made of, for example, the rhodium, tantalum or the combination thereof.

As illustrated in FIG. 5, the MR sensor 210 further includes a pair of hard magnet layers 238 placed at two sides of the MR element 230 on the first gap layer 216 for longitudinally biasing the magnetization of the free layer 237, and an insulating layer 239 for separating and isolating the hard magnet layer 238 from the free layer 237 and the other layers of the MR element 230. The hard magnet layers 238 can be made of a material having high coercive force such as CoPtCr alloy. The insulating layer 239 can be made of alumina such as $Al_2O_3$, or silica such as $SiO_2$.

Figure 7:
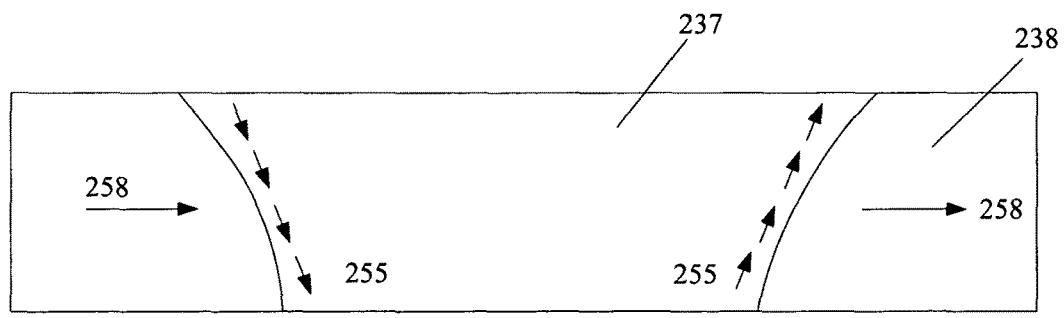
FIG. 7 is a status schematic view illustrating the stable free layer domain of the MR sensor shown in FIG. 6.

Referring to FIGS. 5 and 7, concretely, the pair of hard magnet layers 238 has a magnetic direction, indicated by arrow 258, the magnetic direction 258 orients generally parallel to the ABS 15 (shown in FIG. 4). In the invention, the pinned layer 231 has a magnetic moment or magnetization direction 254 for preventing from rotation in the presence of applied magnetic fields in the desired range of interest. The pinned layer 231 is pinned such that the direction of magnetization is kept constant regardless of an external magnetic field. The magnetization direction 254 of the pinned layer 231 is oriented generally perpendicular to the ABS 15. The free layer 237 contains a ferromagnetic substance and has a direction of magnetization 256 that changes in responds to an external magnetic field. The magnetization direction or the magnetic moment of the free layer 237 orients generally parallel to the ABS 15 in the absence of an applied external magnetic field.

Figure 6:
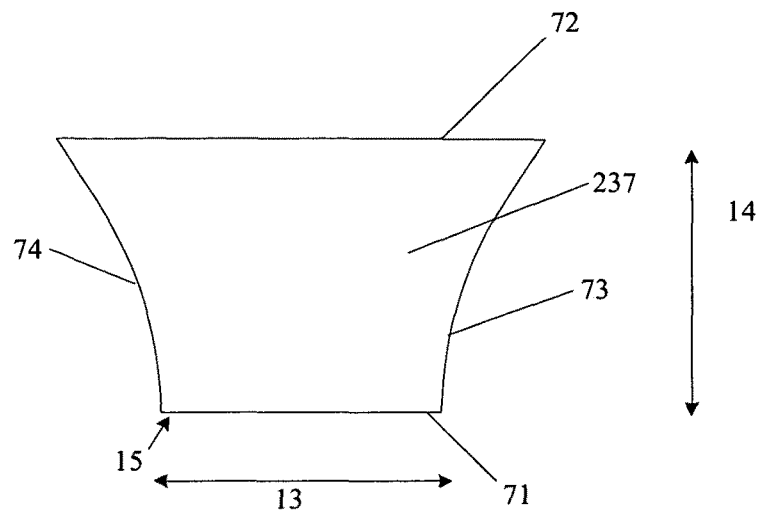
FIG. 6 is a top view of the free layer of the MR sensor shown in FIG. 5.

FIG. 6 shows a free layer of the MR sensor according to the present embodiment of the present invention. Referring to FIG. 6, the free layer 237 is funnel-shaped, which has a first edge 71 facing the ABS 15, a second edge 72 opposite to the first edge 71 and two bevel edges 73, 74. Concretely, the free layer width (FLW) 13, namely the width of the first edge 71 is narrower than the width of the second edge 72. In detail, for example, the free layer 237 preferably narrows from the first edge 71 to the second edge 72 in a parabola shape, and the bevel edges 73 and 74 is bent inwards as a parabola. As shown in FIG. 6, the number 14 is the height of the MR element, namely the MR height.

In comparison with the traditional trapezoidal MR element, the narrower first edge 71 of the funnel-shaped free layer 237 can be obtained under a same total sensing area and a same width of the opposite edge to the first edge. When the first edge 71 of the MR element facing the ABS is lapped, since the first edge 71 is relatively narrower, thus the lapping quantity is decreased, making the lapping time to be shortened and, in turn, improve the lapping efficiency and make the lapping process easier to control. Moreover, because the lapping process of the first edge of the MR element is easier to control, thus the MR height becomes much easier to control.

Understandably, a current density crossing the sensing area near the ABS also becomes bigger due to a narrower first edge under a same current.

On the other hand, since the width of the MR element is decreased under a same total sensing area, namely the track width is decreased and, in turn, the data track density is increased so as to improve the read performance of the slider. In this condition, comparing with the traditional trapezoidal MR element, the weak longitudinal bias area of the MR element 230 of the present invention is reduced under a same MR height and a same width of the opposite edge to the first edge. Thus, the thermal noises of the whole MR element and then the MR sensor are reduced.

Moreover, in comparison with the traditional trapezoidal MR element, the MR sensor 210 of the present invention can provide a large sensing area under the given MR height and FLW, namely the given track width. Due to the larger sensing area, the higher resistance area is obtained, and thus a current density crossing the higher resistance area becomes lower while the sensing current passes through the free layer 237, then an ESD and lifetime threshold performance of the MR sensor is thus improved. In addition, a bigger resistance area can provide a higher MR ratio and a higher state ratio, and thus improving the reliability of the MR sensor.

FIG. 7 shows the schematic of the stable free layer domain of the MR sensor according to the present embodiment of the present invention. As shown in FIG. 7, the magnetic direction 258 of the hard magnet layers 238 aligned generally parallels with direction 256 (shown in FIG. 5) of the free layer 237 to provide the free layer 237 with a generally single magnetic domain state. The hard magnet layer 238 provides a magnetic field for stabilizing the free layer 237, and a de-magnetization field will be induced by the free layer 237, whose direction is opposite to the hard magnet layer 238. Due to the bevel edges 73 and 74 of the funnel-shaped of the free layer 237, the free layer 237 domain can provide a preferred direction 255 which prefer to follow the direction 258 of the hard magnet layer 238. Thus the edge domain of the free layer 237 will not pop up or down randomly, to obtain a stable domain. As the free layer domain will not be fluctuated, the thermal noise, such as the PCN and RTN will be decreased. By this token, comparing with the traditional trapezoidal MR element, the funnel-shaped free layer of the MR element is more stable, also can decrease the thermal noises and improve the performance of the MR sensor.

Clearly, in comparison with the existing trapezoidal MR element, the narrower first edge 71 of the funnel-shaped free layer 237 in the present invention can be obtained under a same total sensing area and a same width of the opposite edge to the first edge. When the first edge 71 of the MR element facing the ABS is lapped, since the first edge 71 is relatively narrower, thus the lapping quantity is decreased, making the lapping time to be decreased and, in turn, improve the lapping efficiency and make the lapping process easier. Moreover, because the lapping process of the first edge of the MR element is easier to control, thus the MR height is much easier to control.

On the other hand, since the width of the MR element is decreased under the same total sensing areas, namely the track width is increased and, in turn, the data track density is increased to improve the read performance of the slider. In comparison with the existing trapezoidal MR element, the MR sensor of the present invention also can provide a larger sensing area under the given MR height and FLW, namely the given track width. Understandably, as the total sensing area of the MR sensor is relative large, the higher resistance area can be used to bring an improved MR ratio, thus the reliability of the MR sensor is improved; and the current density is lower while the sensing current passes through the free layer, causing the ESD and the lifetime threshold performance of the MR sensor to be improved.

Moreover, the edge domain of the free layer according to the present invention will not pop up or down randomly, to obtain a stable domain. As the free layer domain will not be fluctuated, the thermal noise, such as the PCN and RTN will be decreased. Therefore, the funnel-shaped free layer of the MR element also can decrease the noises and improve the performance of the MR sensor.

Figure 8:
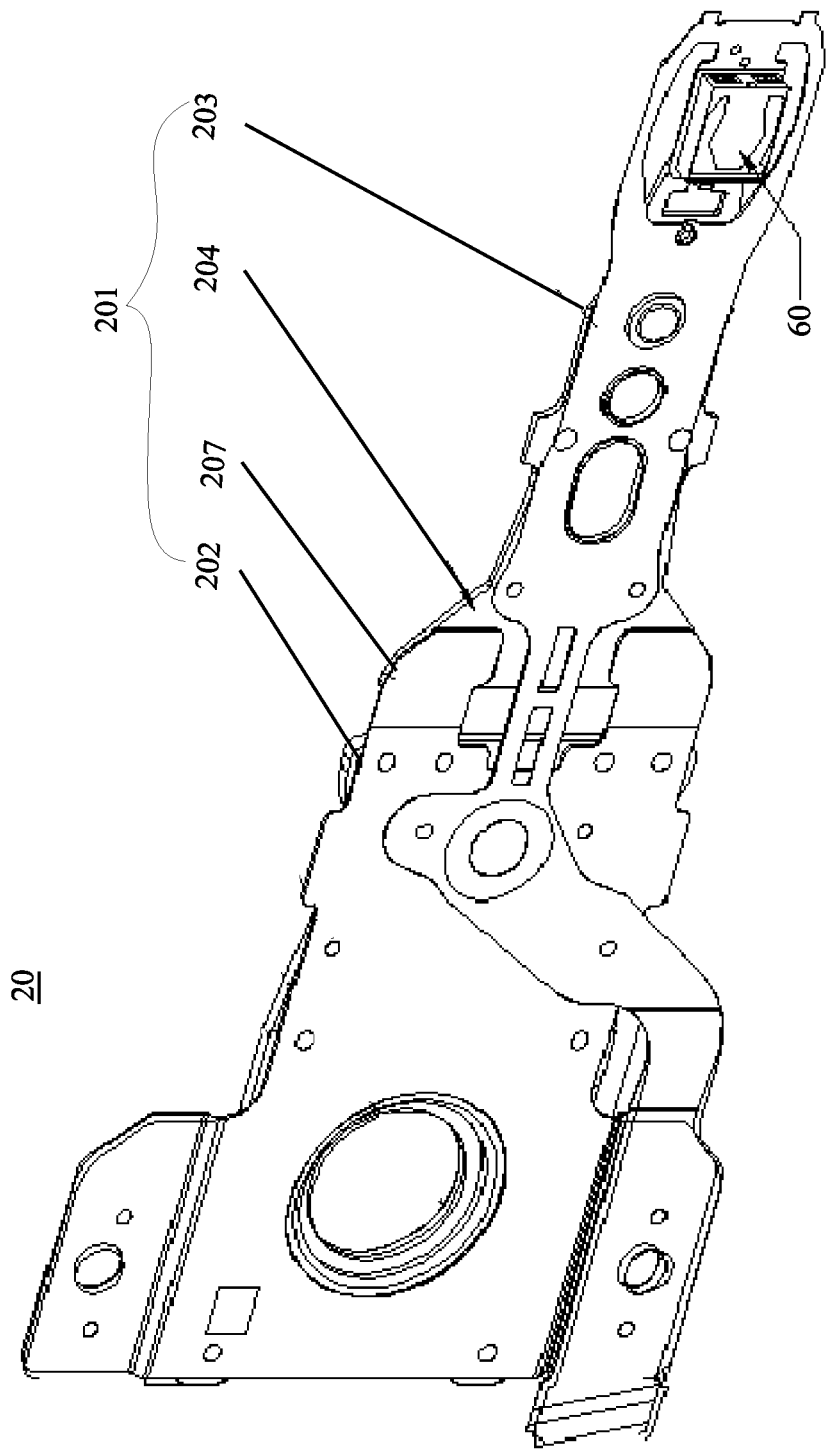
FIG. 8 is a top view of a HGA according to an embodiment of the present invention.

FIG. 8 shows a HGA 20 including the slider 60 with the MR sensor 210 described above according to an embodiment of the present invention. As shown, the HGA 20 generally includes the slider 60 described above and a suspension 201 to support the slider 60. The suspension 201 includes a base plate 202, a hinge 207, a flexure 203 and a load beam 204, all of which are assembled each other. The hinge 207 assembles the hinge 207 to the base plate 202. And the slider 60 is carried on the flexure 203. Because the structure and/or assembly process of suspension of the HGA are well known to persons ordinarily skilled in the art, a detailed description of such structure and assembly is omitted herefrom.

Figure 9:
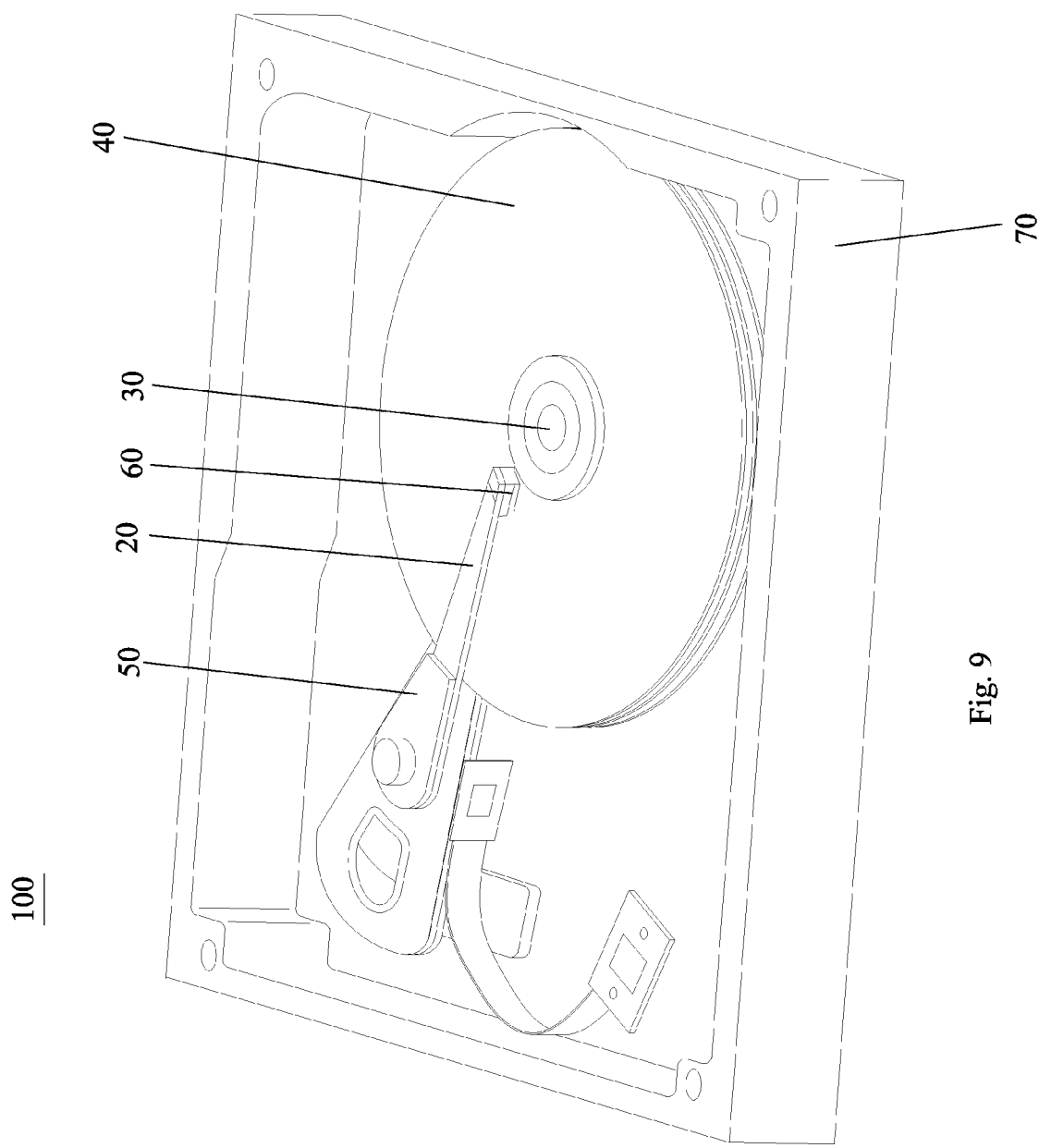
FIG. 9 is a perspective view of a disk drive unit according to an embodiment of the present invention.

FIG. 9 illustrates a disk drive unit 100 including the slider 60 and the HGA 20 according to an embodiment of the present invention. The disk drive unit 100 includes a spindle motor 30, a series of the rotatable disk 40 mounted on the spindle motor 30, the HGA 20, a drive arm 50 connected with the HGA 20, the slider 60 of the HGA 20 set at a far end of the drive arm 50 and including a MR sensor 210 (referring to FIG. 4), all of which are mounted in a housing 70. As well known to a person ordinarily skilled in the art, while the disk drive unit 100 operates, the disk 40 is rotated by the spindle motor 30, and the slider 60 will fly above the disk 40 due to the air pressure drawn by the rotated disk 40 so that the MR sensor 210 in the slider 60 may access the data tracks on disk 40.

While the invention has been described in connection with what are presently considered to be the most practical and preferred embodiments, it is to be understood that the invention is not to be limited to the disclosed embodiments, but on the contrary, is intended to cover various modifications and equivalent arrangements included within the spirit and scope of the invention.

What is claimed is:

1. A magnetoresistive sensor, comprising:
   a first shielding layer;
   a second shielding layer;
   a magnetoresistive element formed therebetween, which comprises an antiferromagnetic layer formed on the first shielding layer, a pinned layer formed on the antiferromagnetic layer, a free layer formed on the pinned layer, and an insulating tunnel barrier layer formed between the pinned layer and the free layer; and
   a pair of hard magnet layers respectively placed on two sides of the magnetoresistive element;
   wherein the free layer is funnel-shaped, having a first edge facing an air bearing surface and a second edge opposite the first edge, the first edge having a narrower width than that of the second edge; and
   wherein each of the hard magnet layers is trapezoid-like, and has a top edge, a bottom edge and a curved edge, wherein the top edge is located at the same level with the second edge, and the bottom edge is located at the same level with the first edge, and the free layer is magnetized by the hard magnet layers to induce an electrical current with a direction parallel to the air bearing surface and perpendicular to the free layer.

2. The magnetoresistive sensor as claimed in claim 1, wherein the free layer substantially narrows from the first edge to the second edge in a parabola.

3. The magnetoresistive sensor as claimed in claim 1, wherein the magnetoresistive element further comprises a cap layer formed between the free layer and the second shielding layer.

4. A magnetic head, comprising:
a magnetoresistive sensor; and
a write head formed on the magnetoresistive sensor;
wherein the magnetoresistive sensor comprises:
  a first shielding layer;
  a second shielding layer;
  a magnetoresistive element formed therebetween, which comprises an antiferromagnetic layer formed on the first shielding layer, a pinned layer formed on the antiferromagnetic layer, a free layer formed on the pinned layer, and an insulating tunnel barrier layer formed between the pinned layer and the free layer; and
  a pair of hard magnet layers respectively placed on two sides of the magnetoresistive element;
wherein the free layer is funnel-shaped, having a first edge facing an air bearing surface and a second edge opposite the first edge, the first edge having a narrower width than that of the second edge; and
wherein each of the hard magnet layers is trapezoid-like, and has a top edge, a bottom edge and a curved edge, wherein the top edge is located at the same level with the second edge, and the bottom edge is located at the same level with the first edge, and the free layer is magnetized by the hard magnet layers to induce an electrical current with a direction parallel to the air bearing surface and perpendicular to the free layer.

5. The magnetic head as claimed in claim 4, wherein the free layer substantially narrows from the first edge to the second edge in a parabola.

6. The magnetic head as claimed in claim 4, wherein the magnetoresistive element further comprises a cap layer formed between the free layer and the second shielding layer.

7. A head gimbal assembly, comprising:
a slider with a magnetoresistive sensor; and
a suspension to support the slider;
wherein the magnetoresistive sensor comprises:
  a first shielding layer;
  a second shielding layer;
  a magnetoresistive element formed therebetween, which comprises an antiferromagnetic layer formed on the first shielding layer, a pinned layer formed on the antiferromagnetic layer, a free layer formed on the pinned layer, and an insulating tunnel barrier layer formed between the pinned layer and the free layer; and
  a pair of hard magnet layers respectively placed on two sides of the magnetoresistive element;
wherein the free layer is funnel-shaped, having a first edge facing an air bearing surface and a second edge opposite the first edge, the first edge having a narrower width than that of the second edge; and
wherein each of the hard magnet layers is trapezoid-like, and has a top edge, a bottom edge and a curved edge, wherein the top edge is located at the same level with the second edge, and the bottom edge is located at the same level with the first edge, and the free layer is magnetized by the hard magnet layers to induce an electrical current with a direction parallel to the air bearing surface and perpendicular to the free layer.

8. The head gimbal assembly as claimed in claim 7, wherein the free layer substantially narrows from the first edge to the second edge in a parabola.

9. The head gimbal assembly as claimed in claim 7, wherein the magnetoresistive element further comprises a cap layer formed between the free layer and the second shielding layer.

10. A disk drive unit, comprising:
a head gimbal assembly with a slider;
a drive arm to connect with the head gimbal assembly;
a rotatable disk; and
a spindle motor to spin the disk;
wherein the slider has a magnetoresistive sensor comprising:
  a first shielding layer;
  a second shielding layer;
  a magnetoresistive element formed therebetween, which comprises an antiferromagnetic layer formed on the first shielding layer, a pinned layer formed on the antiferromagnetic layer, a free layer formed on the pinned layer, and an insulating tunnel barrier layer formed between the pinned layer and the free layer; and
  a pair of hard magnet layers respectively placed on two sides of the magnetoresistive element;
wherein the free layer is funnel-shaped, having a first edge facing an air bearing surface and a second edge opposite the first edge, the first edge having a narrower width than that of the second edge; and
wherein each of the hard magnet layers is trapezoid-like, and has a top edge, a bottom edge and a curved edge, wherein the top edge is located at the same level with the second edge, and the bottom edge is located at the same level with the first edge, and the free layer is magnetized by the hard magnet layers to induce an electrical current with a direction parallel to the air bearing surface and perpendicular to the free layer.

\* \* \* \* \*